(12) United States Patent
Wang et al.

(10) Patent No.: US 12,171,135 B2
(45) Date of Patent: Dec. 17, 2024

(54) FOLDABLE DISPLAY AND TERMINAL DEVICE

(71) Applicants: Chengdu BOE Optoelectronics Technology Co., Ltd., Sichuan (CN); BOE Technology Group Co., Ltd., Beijing (CN)

(72) Inventors: Chao Wang, Beijing (CN); Binfeng Feng, Beijing (CN); Xingguo Liu, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days.

(21) Appl. No.: 17/598,967

(22) PCT Filed: Jan. 13, 2021

(86) PCT No.: PCT/CN2021/071496
§ 371 (c)(1),
(2) Date: Oct. 21, 2021

(87) PCT Pub. No.: WO2021/208540
PCT Pub. Date: Oct. 21, 2021

(65) Prior Publication Data
US 2024/0057446 A1 Feb. 15, 2024

(30) Foreign Application Priority Data
Apr. 17, 2020 (CN) .......................... 202020585565.1

(51) Int. Cl.
*H10K 59/80* (2023.01)
*H10K 102/00* (2023.01)

(52) U.S. Cl.
CPC ..... *H10K 59/873* (2023.02); *H10K 2102/311* (2023.02)

(58) Field of Classification Search
CPC .......... H10K 59/873; H10K 2102/311; H10K 77/111; G09F 9/30; G09F 9/33
See application file for complete search history.

(56) References Cited

U.S. PATENT DOCUMENTS

| 2009/0209160 | A1 | 8/2009 | Jung |
| 2021/0013447 | A1* | 1/2021 | Lee ...................... G06F 1/1637 |
| 2021/0217975 | A1 | 7/2021 | Gu et al. |

FOREIGN PATENT DOCUMENTS

| CN | 109903679 A | 6/2019 |
| CN | 209625665 U | 11/2019 |

(Continued)

OTHER PUBLICATIONS

CN2020205855651 First notification to make rectification.
CN2020205855651 Notification to grant patent right for utility model.

*Primary Examiner* — Kyoung Lee
(74) *Attorney, Agent, or Firm* — IPro, PLLC

(57) ABSTRACT

Provided is a foldable display. The foldable display includes a rigid substrate, a bonding layer, and a flexible display panel which are sequentially stacked; wherein the rigid substrate includes a first substrate area and a second substrate area, the second substrate area being foldable; and the bonding layer includes a first bonding area and a second bonding area, the first bonding area being laminated to the first substrate area and the second bonding area being laminated to the second substrate area; wherein a target parameter of the first bonding area is larger than a target parameter of the second bonding area, the target parameter including at least one of a viscosity and an elastic modulus.

20 Claims, 4 Drawing Sheets

(56) References Cited

FOREIGN PATENT DOCUMENTS

| CN | 110807991 A | 2/2020 |
|----|-------------|--------|
| CN | 110853510 A | 2/2020 |
| CN | 110854177 A | 2/2020 |
| CN | 212342186 U | 1/2021 |

* cited by examiner

FOLDABLE DISPLAY AND TERMINAL DEVICE

CROSS-REFERENCE TO RELATED APPLICATION

The application is a US national phase application based on PCT/CN2021/071496, filed on Jan. 13, 2021, which claims priority to Chinese Patent Application No. 202020585565.1, filed on Apr. 17, 2020 and entitled "CURVED FOLDABLE DISPLAY MODULE AND MOBILE TERMINAL," which is incorporated herein by reference in its entirety.

TECHNICAL FIELD

The present disclosure relates to a foldable display and a terminal device.

BACKGROUND

With the development of flexible display technology, a foldable display has emerged.

SUMMARY

The present disclosure provides a foldable display and a terminal device.

In a first aspect, a foldable display is provided. The foldable display includes a rigid substrate, a bonding layer, and a flexible display panel which are sequentially stacked;
wherein the rigid substrate includes a first substrate area and a second substrate area, the second substrate area being foldable; and
the bonding layer includes a first bonding area and a second bonding area, the first bonding area being laminated to the first substrate area while the second bonding area being laminated to the second substrate area;
wherein a target parameter of the first bonding area is larger than a target parameter of the second bonding area, the target parameter including at least one of a viscosity and an elastic modulus.

Optionally, a material of the first bonding area includes a pressure-sensitive adhesive (PSA) and a material of the second bonding area includes an optical clear adhesive (OCA).

Optionally, the first bonding area is provided with a concave-convex structure.

Optionally, the concave-convex structure includes at least one of a first concave structure, a first hollow structure, and a first convex structure.

Optionally, the first bonding area is provided with a plurality of the concave-convex structures arranged in an array.

Optionally, an orthographic projection of the concave-convex structure on the rigid substrate is rhombic, circular, or oval.

Optionally, the second bonding area is provided with the concave-convex structure.

Optionally, the second substrate area is provided with a target structure, the target structure including at least one of a second concave structure and a second hollow structure.

Optionally, the second substrate area is provided with a plurality of the concave-convex structures arranged in an array.

Optionally, an opening of the target structure is rhombic, circular, or oval.

Optionally, a material of the rigid substrate includes stainless steel.

Optionally, the flexible display panel is a flexible organic light-emitting diode (OLED) panel.

Optionally, the first substrate area is curved.

Optionally, the rigid substrate includes two first substrate areas disposed on two sides of the second substrate area respectively;
the bonding layer includes two first bonding areas disposed on two sides of the second bonding area; and
the two first substrate areas in the rigid substrate are in one-to-one correspondence with the two first bonding areas in the bonding layer, and each of the first bonding areas is laminated to the corresponding first substrate area.

Optionally, the foldable display further includes a polarizer, wherein the polarizer covers a side of the flexible display panel distal from the rigid substrate.

Optionally, the foldable display further includes a flexible protecting layer, wherein the flexible protecting layer covers a side of the polarizer distal from the rigid substrate.

In a second aspect, a terminal device is provided. The terminal device includes any one of the foldable displays as defined in the first aspect.

Optionally, the terminal device is a mobile terminal device.

DETAILED DESCRIPTION

Figure 1:
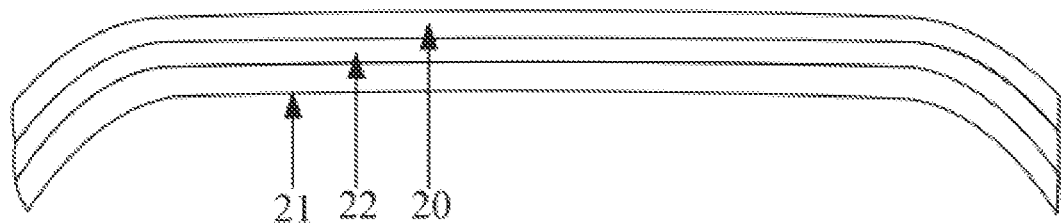
FIG. 1 is a schematic structural diagram of a foldable display according to an embodiment of the present disclosure.

To describe the present disclosure more clearly, the present disclosure will be further described below with reference to preferred embodiments and accompanying drawings. Similar parts in the drawings are represented by the same reference numerals. Those skilled in the art should understand that the content specifically described below is illustrative and not restrictive, and should not be constructed as limiting the protection scope of the present disclosure.

FIG. 1 is a schematic structural diagram of a foldable display according to an embodiment of the present disclosure. As shown in FIG. 1, the foldable display includes a rigid substrate 21, a flexible display panel 20, and an optical clear adhesive (OCA) 22. The rigid substrate 21, the OCA 22, and the flexible display panel 20 are stacked in sequence. The flexible display panel 20 is bonded to the rigid substrate 21 by the OCA 22. The rigid substrate 21 may be a curved rigid substrate or a planar rigid substrate, and FIG. 1 takes the curved rigid substrate as an example.

The rigid substrate 21 is foldable. In response to that the rigid substrate 21 is folded, the OCA 22 and the flexible display panel 20 are also folded. In addition, in response to that the rigid substrate 21 and the flexible display panel 20 are folded simultaneously, a non-foldable area (e.g., an edge area) of the OCA 22 is in a state of being continuously pulled, such that the non-foldable area of the OCA 22 is more prone to separate from the rigid substrate 21 and the flexible display panel 20, thus causing the flexible display panel 20 to separate from the rigid substrate 21, which affects normal use of the foldable display.

The present disclosure provides a foldable display. The foldable display can avoid that the rigid substrate is separated from the flexible display panel, thereby ensuring the normal use of the foldable display.

Figure 2:
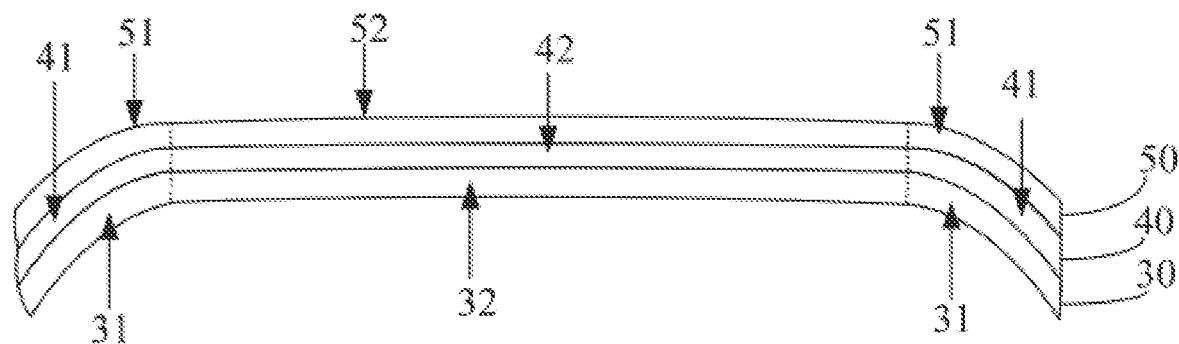
FIG. 2 is a schematic structural diagram of another foldable display according to an embodiment of the present disclosure.

Exemplarily, FIG. 2 is a schematic structural diagram of a foldable display according to an embodiment of the present disclosure. As shown in FIG. 2, the foldable display includes a rigid substrate 30, a bonding layer 40, and a flexible display panel 50.

Figure 3:
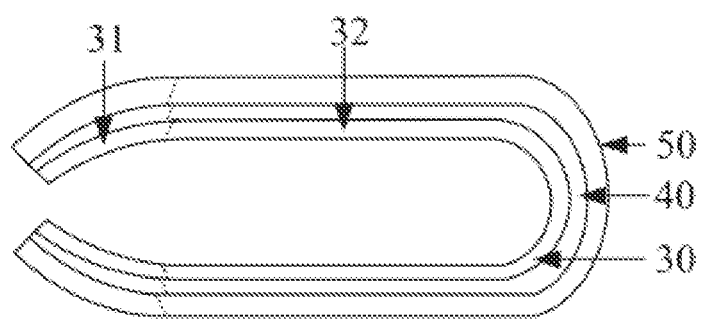
FIG. 3 is a schematic foldable diagram of the foldable display shown in FIG. 2 according to an embodiment of the present disclosure.

The rigid substrate 30 includes a first substrate area 31 and a second substrate area 32. The first substrate area 31 and the second substrate area 32 may be connected to each other. With reference to FIGS. 2 and 3, the second substrate area 32 is foldable. In response to that the second substrate area 32 is folded, the entire rigid substrate 30 is folded and the foldable display is in a folded state. In some embodiments, a material of the rigid substrate 30 may include stainless steel, and the rigid substrate 30 may be a stainless steel plate with a certain strength. The rigid substrate 30 may be acquired by stamping and forming a steel sheet with a thickness of 0.10 millimeters (mm) or more. The rigid substrate 30 may be a planar or curved rigid substrate. For example, the rigid substrate 30 is a curved rigid substrate as shown in FIG. 2. In addition, the first substrate area 31 in the rigid substrate 30 is a curved substrate area and the second substrate area 32 is a foldable planar rigid substrate area. In response to that the rigid substrate 30 is the planar rigid substrate, both the first substrate area 31 and the second substrate area 32 are planar substrate areas.

The bonding layer 40 includes a first bonding area 41 and a second bonding area 42. The first bonding area 41 is laminated to the first substrate area 31 and the second bonding area 42 is laminated to the second substrate area 32. A target parameter of the first bonding area 41 is larger than a target parameter of the second bonding area 42. The target parameter includes at least one of a viscosity and an elastic modulus. It can be seen that a viscosity of the first bonding area 41 is greater than a viscosity of the second bonding area 42; or, an elastic modulus of the first bonding area 41 is greater than an elastic modulus of the second bonding area 42; or, the viscosity of the first bonding area 41 is greater than the viscosity of the second bonding area 42, and the elastic modulus of the first bonding area 41 is greater than the elastic modulus of the second bonding area 42.

The flexible display panel 50 may be any flexible display, such as a flexible organic light-emitting diode (OLED) display panel, or other types of flexible display panels, which is not limited in the embodiments of the present disclosure. The flexible display panel 50 covers the bonding layer 40, and the flexible display panel 50 is bonded to the rigid substrate 30 by the bonding layer 40. The flexible display panel 50 may include a first display area 51 and a second display area 52. The first display area is laminated to the first bonding area 41, and the second display area 52 is laminated to the second bonding area 42.

In summary, in the foldable display provided by the embodiments of the present disclosure, the non-foldable area in the bonding area is the first bonding area, and the target parameter of the first bonding area is larger than the target parameter of the second bonding area, the target parameter including at least one of the viscosity and the elastic modulus. In response to that the foldable display is folded, the non-foldable area, (i.e., the first bonding area) in the bonding layer is less prone to separate from the flexible display panel and the rigid substrate. Therefore, the flexible display panel is prevented from being separated from the rigid substrate, thereby ensuring the normal use of the foldable display.

Optionally, a material of the first bonding area 41 includes a pressure-sensitive adhesive (PSA), and a material of the second bonding area 42 includes an optical clear adhesive (OCA). It should be understood that the OCA has the characteristics of thin thickness, low viscosity, low elastic modulus, foldability, high creep recovery, and the like. Therefore, the second bonding area 42 can still be laminated stably between the second substrate area and the second display area after being folded a plurality of times. In response to that the foldable display is folded, the first bonding area 41 does not need to be folded. Simultaneously, because of the high viscosity and the high elastic modulus of the PSA, breaking of the first bonding area 41 due to an excessive rebound force of the flexible display panel 50 in response to that the foldable display is folded may be avoided, and a separation between the flexible display panel 50 and the rigid substrate 30 in the first bonding area 41 may also be avoided.

Optionally, the first bonding area 41 and the second bonding area 42 may be integrally formed. Alternatively, the first bonding area 41 and the second bonding area 42 may be independent of each other. For example, the first bonding area 41 and the second bonding area 42 are integrally formed as shown in FIGS. 2 and 3. In the case that the first bonding area 41 and the second bonding area 42 are independent of each other, the first bonding area 41 and the second bonding area 42, which are independent of each other, may be laminated directly on the rigid substrate 30 respectively during the process of manufacturing the foldable display. In this way, the first bonding area 41 and the second bonding area 42 which are independent of each other may be applied to foldable displays with different sizes.

Figure 4:
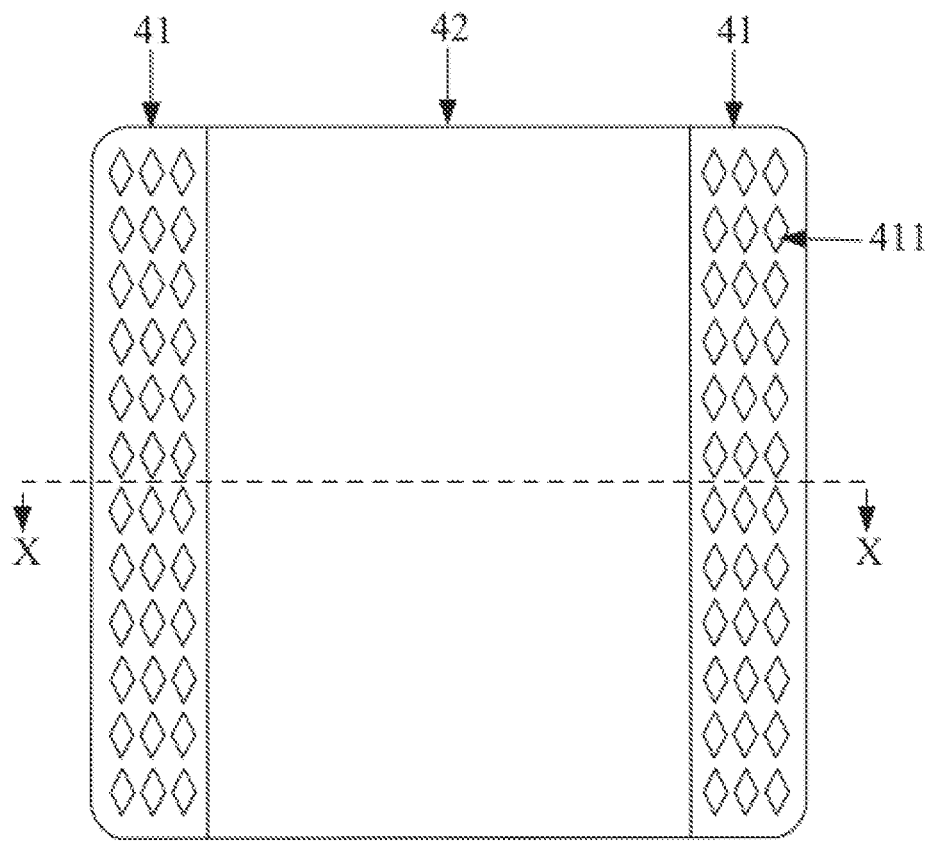
FIG. 4 is a top view of a bonding layer according to an embodiment of the present disclosure.
Figure 5:
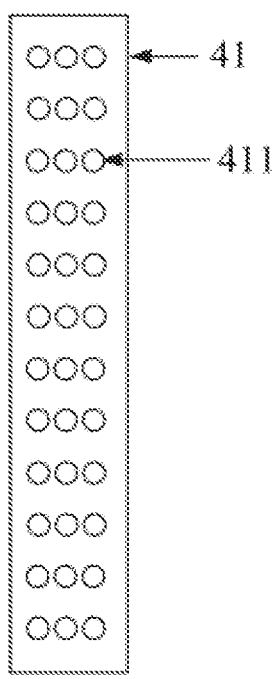
FIG. 5 is a schematic diagram of a concave-convex structure according to an embodiment of the present disclosure.
Figure 6:
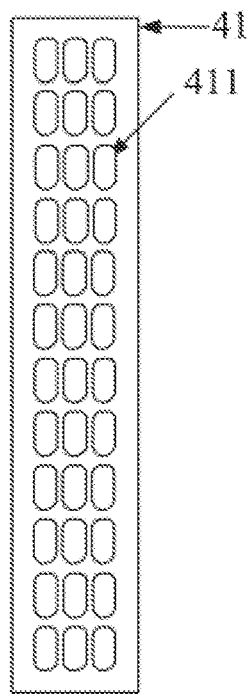
FIG. 6 is a schematic diagram of another concave-convex structure according to an embodiment of the present disclosure.

Optionally, FIG. 4 is a top view of a bonding layer 40 according to an embodiment of the present disclosure. The bonding layer 40 shown in FIG. 2 is a schematic diagram of a cross-section XX shown in FIG. 4. In addition, a concave-convex structure 411 in the foldable display is not shown in FIG. 2, and the first bonding area 41 and the second bonding area 42 are integrally formed in FIG. 4. However, the first bonding area 41 and the second bonding area 42 shown in FIG. 4 may also be independent of each other. As shown in FIG. 4, the first bonding area 41 may further include a concave-convex structure 411. Optionally, the concave-convex structure 411 may include at least one of a first concave structure, a first hollow structure, and a first convex structure, and FIG. 4 takes that the concave-convex structure 411 includes the first concave structure, and the first hollow structure passes through the first bonding area as an example. Optionally, as shown in FIG. 4, the first bonding area may be provided with a plurality of the concave-convex structures 411 arranged in an array. An orthographic projection of the concave-convex structure 411 on the rigid substrate 30 may be rhombic, circular, or oval, and FIG. 4 takes that the orthographic projection is rhombic as an example. As shown in FIG. 5, the orthographic projection may also be circular; or, the orthographic projection may also be oval; or, the orthographic projection may also be a shape as shown in FIG. 6.

Figure 7:
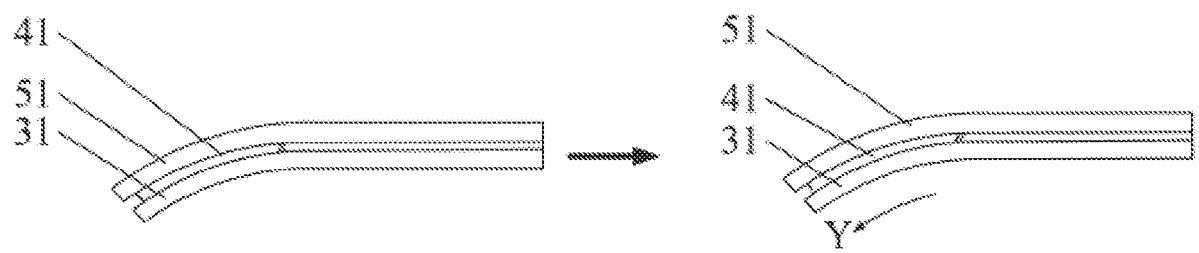
FIG. 7 is a partial schematic structural diagram of a foldable display before and after being folded according to an embodiment of the present disclosure.

FIG. 7 is a partial schematic structural diagram of a foldable display before and after being folded according to an embodiment of the present disclosure, and FIG. 7 takes that the first bonding area 41 and the second bonding area 42 are independent of each other as an example, but the first bonding area 41 and the second bonding area 42 shown in FIG. 7 may also be integrally formed. As shown in FIG. 7, the rigid substrate 30 disposed on an innermost side of the foldable display will be subjected to an extruding force in response to that the foldable display is folded. As a result, the first substrate area 31 at an end of the rigid substrate 30 will be dislocated towards a direction Y as shown in FIG. 7. Because a first structure 411 is arranged in the first bonding area 41 laminated to the first substrate area 31, which may effectively weaken the rigidity of the first bonding area 41 and reduces the internal stress of the first bonding area 41. Therefore, the first bonding area 41 may be dislocated with the first substrate area 31 in response to that the foldable display is folded, thereby effectively releasing the dislocating stress on the rigid substrate 30 in response to that the foldable display is folded and avoiding breaking of the rigid substrate 30 and distortion of the foldable display, which ensures the quality of the foldable display module.

Optionally, the second bonding area 42 may also be provided with a concave-convex structure, and the embodiment of the present disclosure takes that the second bonding area 42 is not provided with the concave-convex structure as an example. The concave-convex structure in the second bonding area 42 may refer to the concave-convex structure in the first bonding area 41, which will not be repeated in the embodiments of the present disclosure. In response to that the second bonding area 42 is provided with the concave-convex structure, the rigidity of the second bonding area 42 is small and the internal stress of the second bonding area 42 is also small, which can further effectively release the dislocating stress on the rigid substrate 30 in response to that the foldable display is folded.

Optionally, the second substrate area 32 may be provided with a target structure. The target structure may include at least one of a second concave structure and a second hollow structure, and the second hollow structure passes through the second substrate area 32. The target structure can reduce the rigidity of the second substrate area 32, such that the second substrate area 32 is prone to be folded but not prone to be broken, which extends the service life of the foldable display. Optionally, an opening of the target structure may be rhombic, circular, or oval. The second substrate area 32 may be provided with a plurality of target structures arranged in an array.

In some embodiments, with reference to FIG. 2, the foldable display may include two first substrate areas 31, a second substrate area 32, two first bonding areas 41, a second bonding area 42, two first display areas 51, and a second display area 52. The two first substrate areas 31 are disposed on two sides of the second substrate area 32 respectively, the two first bonding areas 41 are disposed on two sides of the second bonding area 42, and the two first display areas 51 are disposed on two sides of the second display area 52. The two first substrate areas 31 are connected to the second substrate area 32, the two first bonding areas 41 are connected to the second bonding area 42, and the two first display areas 51 are connected to the second display area 52. The two first substrate areas 31 are in one-to-one correspondence with the two first bonding areas 41 and the two first display areas 51 are in one-to-one correspondence with the two first bonding areas 41. The first bonding area 41 is laminated to the corresponding first substrate area 31, and the first bonding area 41 is also laminated to the corresponding first display area 51.

It should be noted that the embodiment of the present disclosure takes the foldable display shown in FIG. 2 as an example, and in the foldable display, the number and shapes of the first substrate areas 31 the number and shapes of the first bonding areas 41, and the number and shapes of the first display areas 51 are not limited in the embodiment of the present disclosure. For example, the number of the first substrate areas 31, the number of the first bonding areas 41, and the number of the first display areas 51 may all be one, and the first substrate areas 31, the first bonding areas 41, and the first display areas 51 may all be planar areas.

Figure 8:
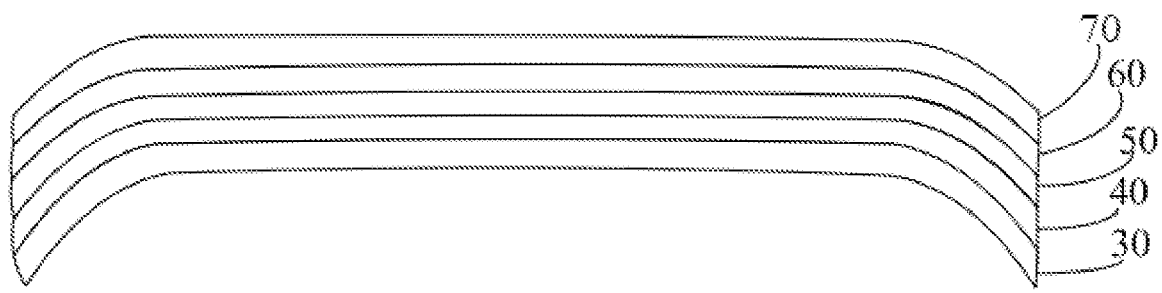
FIG. 8 is a schematic structural diagram of another foldable display according to an embodiment of the present disclosure.

Optionally, as shown in FIG. 8, the foldable display provided by the embodiment of the present disclosure may further include a polarizer 60 and a flexible protecting layer 70. The polarizer 60, which covers a side of the flexible display panel 50 distal from the rigid substrate 30, enables the foldable display to achieve the function of preventing light reflection, thereby improving the display effect of the foldable display. The flexible protecting layer 70 covers a side of the polarizer 60 distal from the rigid substrate 30. The flexible protecting layer 70 is enabled to protect the polarizer 60, the flexible display panel 50, the bonding layer 40, and the rigid substrate 30. The foldable display may also be provided with other structures, which are not limited in the embodiments of the present disclosure.

During the process of manufacturing the foldable display provided by the embodiment of the present disclosure, the bonding layer 40 may be laminated to the rigid substrate 30 at first, and then the flexible display panel 50 may be laminated to the bonding layer 40. The first bonding area 41 and the second bonding area 42 in the bonding layer 40 may be independent of each other, or, the first bonding area 41 and the second bonding area 42 may be integrally formed. In response to that the first bonding area 41 and the second bonding area 42 are independent of each other, the first bonding area 41 may be laminated to the first substrate area 31 in the rigid substrate 30, and the second bonding area 42 may be laminated to the second substrate area 32 in the rigid substrate 30. In response to that the first bonding area 41 and the second bonding area 42 are integrally formed, the entire bonding layer 40 may be laminated directly to the rigid substrate 30.

In another embodiment of the present disclosure, a terminal device is provided. The terminal device includes the foldable display as described above. Optionally, the terminal device may be a mobile terminal device, such as a mobile phone, a tablet, a laptop, or the like. The terminal device may be not a mobile terminal device, such as a television or the like.

The above embodiments of the present disclosure are only to clearly explain the examples of the present disclosure, not for the limitation of the implementations of the present disclosure. For those of ordinary skill in the art, other changes or variations in different forms can be made based on the above description. Here, it is impossible to enumerate all the implementations. Any obvious changes or variations derived from the technical solutions of the present disclosure are still within the protection scope of the present disclosure.

What is claimed is:

1. A foldable display, comprising a rigid substrate, a bonding layer, and a flexible display panel which are sequentially stacked;
wherein the rigid substrate comprises a first substrate area and a second substrate area, the second substrate area being foldable; and
the bonding layer comprises a first bonding area and a second bonding area, the first bonding area being laminated to the first substrate area and the second bonding area being laminated to the second substrate area;
wherein a target parameter of the first bonding area is larger than a target parameter of the second bonding area, the target parameter comprising at least one of a viscosity and an elastic modulus; and
the first bonding area is provided with a concave-convex structure.

2. The foldable display according to claim 1, wherein a material of the first bonding area comprises a pressure-sensitive adhesive and a material of the second bonding area comprises an optical clear adhesive.

3. The foldable display according to claim 1, wherein the concave-convex structure comprises at least one of a first concave structure, a first hollow structure, and a first convex structure.

4. The foldable display according to claim 1, wherein the first bonding area is provided with a plurality of the concave-convex structures arranged in an array.

5. The foldable display according to claim 1, wherein an orthographic projection of the concave-convex structure on the rigid substrate is rhombic, circular, or oval.

6. The foldable display according to claim 1, wherein the second bonding area is provided with the concave-convex structure.

7. The foldable display according to claim 1, wherein the flexible display panel is a flexible organic light-emitting diode panel.

8. The foldable display according to claim 1, wherein the first substrate area is curved.

9. The foldable display according to claim 8, wherein the rigid substrate comprises two first substrate areas disposed on two sides of the second substrate area;
the bonding layer comprises two first bonding areas disposed on two sides of the second bonding area; and
the two first substrate areas in the rigid substrate are in one-to-one correspondence with the two first bonding areas in the bonding layer, and each of the first bonding areas is laminated to the corresponding first substrate area.

10. The foldable display according to claim 1, further comprising a polarizer, wherein the polarizer covers a side of the flexible display panel distal from the rigid substrate.

11. The foldable display according to claim 10, further comprising a flexible protecting layer, wherein the flexible protecting layer covers a side of the polarizer distal from the rigid substrate.

12. A terminal device, comprising the foldable display as defined in claim 1.

13. The terminal device according to claim 12, wherein the terminal device is a mobile terminal device.

14. The terminal device according to claim 12, wherein a material of the first bonding area comprises a pressure-sensitive adhesive and a material of the second bonding area comprises an optical clear adhesive.

15. A foldable display, comprising a rigid substrate, a bonding layer, and a flexible display panel which are sequentially stacked;
wherein the rigid substrate comprises a first substrate area and a second substrate area, the second substrate area being foldable; and
the bonding layer comprises a first bonding area and a second bonding area, the first bonding area being laminated to the first substrate area and the second bonding area being laminated to the second substrate area;
wherein a target parameter of the first bonding area is larger than a target parameter of the second bonding area, the target parameter comprising at least one of a viscosity and an elastic modulus; and
the second substrate area is provided with a target structure, the target structure comprising at least one of a second concave structure and a second hollow structure.

16. The foldable display according to claim 15, wherein the second substrate area is provided with a plurality of the target structures arranged in an array.

17. The foldable display according to claim 15, wherein an opening of the target structure is rhombic, circular, or oval.

18. A terminal device, comprising the foldable display as defined in claim 15.

19. A foldable display, comprising a rigid substrate, a bonding layer, and a flexible display panel which are sequentially stacked;
wherein the rigid substrate comprises a first substrate area and a second substrate area, the second substrate area being foldable; and
the bonding layer comprises a first bonding area and a second bonding area, the first bonding area being laminated to the first substrate area and the second bonding area being laminated to the second substrate area;
wherein a target parameter of the first bonding area is larger than a target parameter of the second bonding area, the target parameter comprising at least one of a viscosity and an elastic modulus; and
a material of the rigid substrate comprises stainless steel.

20. A terminal device, comprising the foldable display as defined in claim 19.

* * * * *